United States Patent

Matsuoka

[11] Patent Number: 5,299,948
[45] Date of Patent: Apr. 5, 1994

[54] SOCKET FOR CIRCUIT ELEMENT

[75] Inventor: Noriyuki Matsuoka, Yokohama, Japan

[73] Assignee: Yamaichi Electronics Co., Ltd., Tokyo, Japan

[21] Appl. No.: 991,406

[22] Filed: Dec. 16, 1992

[30] Foreign Application Priority Data

Jul. 7, 1992 [JP] Japan .................. 4-204380

[51] Int. Cl.$^5$ .......................................... H01R 11/22
[52] U.S. Cl. ................................ 439/266; 439/331
[58] Field of Search .................... 439/70–73, 439/259–264, 266–270, 330, 331

[56] References Cited

U.S. PATENT DOCUMENTS 5,009,609  4/1991  Matsuoka et al. ............. 439/266 X
5,147,212  9/1992  Uratsuji et al. ................. 439/266
5,195,903  3/1993  Uratsuji ........................... 439/331

FOREIGN PATENT DOCUMENTS 4-154065  5/1992  Japan .

Primary Examiner—Larry I. Schwartz
Assistant Examiner—Khiem Nguyen
Attorney, Agent, or Firm—Wenderoth, Lind & Ponack

[57] ABSTRACT

A circuit element receiving device has a plurality of resilient contacts contactable with corresponding leads of a circuit element received in the device, and an operating member adapted to shift the contacts away from the leads against resiliency of the contacts. The operating member has a first cam portion engagable with the contacts in such a manner as to be able to move contacting portions of the contacts upwardly away from the leads and a second cam portion engagable with the contacts in such a manner as to thereafter move the contacting portions laterally away from the leads, the first cam portion acting on the contacts prior to the second cam portion.

2 Claims, 4 Drawing Sheets

SOCKET FOR CIRCUIT ELEMENT

BACKGROUND OF THE INVENTION

1. Field of the Invention

This invention relates to a socket in which contacts are shifted backwardly by an operating member so that the contacts are moved away from a circuit element. The term "circuit element" used herein refers to an element which forms a circuit.

2. Brief Description of the Prior Art

According to the invention discussed in Japanese Patent Early Laid-Open Publication No. Hei 4-154065, contacts arranged in rows are engaged with a swing lever, so that when the swing lever is swung, the contacts can be shifted, as a group, backwardly away from leads of an electric part in order to facilitate zero-force insertion of the electric part.

However, this prior art has the problem that when the contacts are shifted backwardly upon operation of the swing lever, or when the contacts are shifted forwardly by elasticity of the contacts, a vertical contact pressure is difficult to obtain efficiently because a contacting portion of each contact is brought into contact with or moved away from an upper surface of each lead at a comparatively small angle of inclination. As a result, reliability of contact is lowered.

Recently, there has been a tendency that miniaturization of the contacts has increased and elasticity has been lowered, so that a proper contact pressure is increasingly difficult to obtain. A solution to this problem is required. Furthermore, since the contacting portion of each contact is brought closer to the upper surface of each lead from a location away from the lead at a low angle, there is the risk that the contacting portion will collide with the leading end of each lead owing to a manufacturing error, causing turning-up or warping of the leading end of each lead, etc.

SUMMARY OF THE INVENTION

It is therefore a general object of the present invention to provide a socket for a circuit element which is capable of overcoming the above-described problem.

A specific object of the present invention is to provide a socket for a circuit element, in which a contacting portion of each contact is brought into contact with an upper surface of each lead under a comparatively strong pressure, and in such a way that the contacting portion will not be damaged due to a collision with the leading end of each lead when the contacting portion is brought into contact with the upper surface of each lead.

To achieve the above object, there is essentially provided a circuit element comprising a plurality of contacts having elasticity which are arranged in such a manner as to be able to contact a plurality of leads of said element, and an operating member adapted to shift said contacts to a location away from said leads against elasticity of said contacts, said circuit element further comprising a first cam portion formed in such a manner as to be able to move contacting portions of said contacts upwardly away from said leads against the elasticity of said contacts, and a second cam portion formed in such a manner as to be able to move said contacting portions backwardly away from said leads, said first cam portion acting on said contacts prior to said second cam portion, said second cam portion being allowed to act on said contacts under the action of the said first cam portion.

As described above, the first cam portion acts as means for moving the contacting portions of the contacts generally upwardly away from the leads, while the second cam portion acts as means for moving the contacting portions of the contacts generally backwardly away from the leads. Since the first and second cam portions have their own functions, there can be easily obtained a favorable design with a simple construction, in which the contacting portions of the contacts can not only be moved away from the leads but also brought into contact with the leads at an inclination angle generally equal to or larger than the right angles (perpendicular) with respect to upper surfaces of the leads respectively. Similarly, the contacting portions of the contacts can be moved backwardly efficiently by the second cam portion.

By virtue of the above-described arrangement, a vertical contact pressure of the contacting portion of each contact with respect to the upper surface of each lead can be obtained efficiently. As a result, each contacting portion can be highly reliably brought into contact with each lead with a high contact pressure. This contact pressure can be properly obtained particularly for minute contacts.

Furthermore, since the contacting portions are brought into contact with the leads at an inclination angle generally equal to or larger than the right angles (perpendicular) with respect to upper surfaces of the leads respectively, possible collision between the leading ends of the leads and the contacting portions of the contacts, and possible damage resulting therefrom can be prevented effectively.

DETAILED DESCRIPTION OF THE EMBODIMENT

Figure 1:
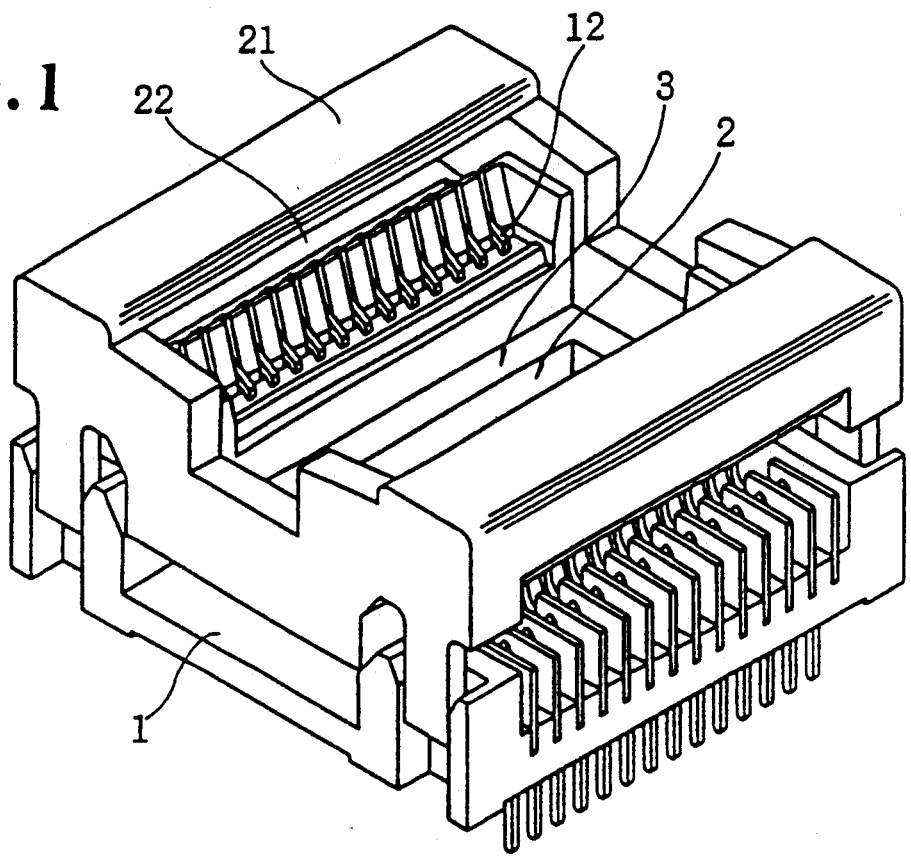
FIG. 1 is a perspective view of the socket according to one embodiment of the present invention.

One embodiment of the present invention will now be described in detail with reference to FIGS. 1 through 8 inclusive. A base number 1 formed of an insulating material has a central opening 2 which is open at upper and lower surfaces 2, an accommodation space 3 being formed on an upper side of the central opening 2, a plurality of contacts 4 being arranged in an array at least on two opposite sides of the accommodation space 3.

The contacts 4 are mounted in the base member 1. Each contact 4 has a male terminal 5 extending downward from the lower surface of the base member 1, a plane portion 6 connected to a basal portion of the male terminal 5 and vertically extending from an upper surface of a mounting wall of the contact 4, and a spring portion 7 connected to an inner edge of an upper end of the plane portion 6.

The spring portion 7 is curved such that it is extended first downward from an area of connection (basal portion 8) with respect to the plane portion 6 and then turned upwardly and backwardly to the vicinity of the area of connection 8. In other words, an angle of curvature is set such that the spring portion 7 has a curved-shape facing downward, and a short space 10 is left between the basal portion 8 and an upper end 9 thereof extending from the basal portion 8, so that the curved-shape of the spring portion 7 is open at an upper location. This angle of curvature is 180° or more, and preferably 250° or more. A contacting arm 11 extends from the upper end 9 of the curved spring portion 7 in such a manner as to incline forwardly, and a contacting portion 12 is formed on an upper end of the contacting arm 11 in such a manner as to project forwardly and then downwardly.

Figure 3:
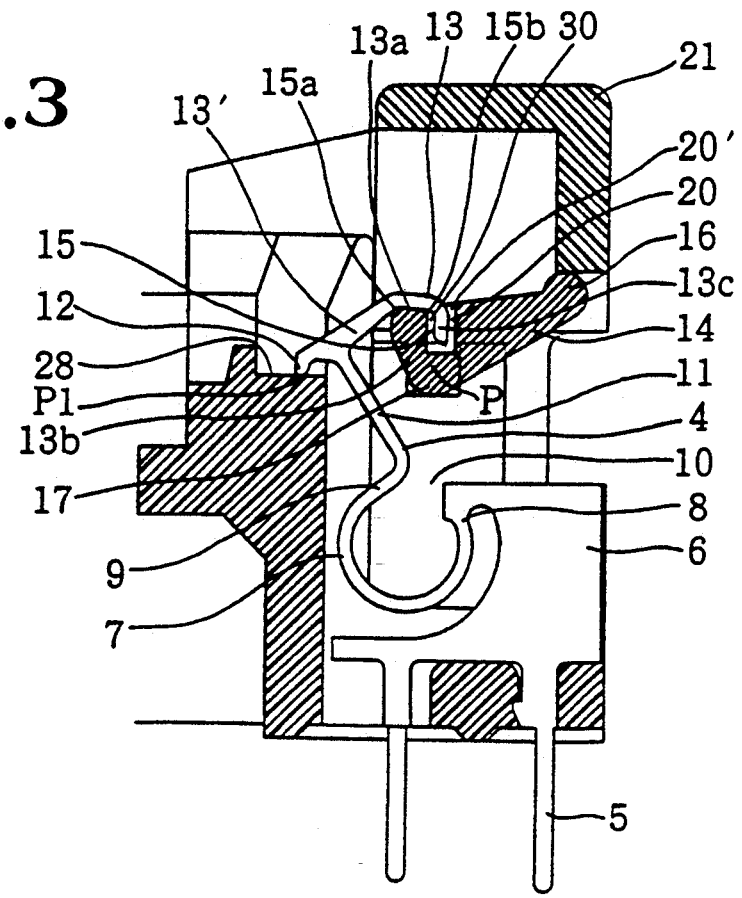
FIG. 3 is a sectional view of an important portion of the socket, showing the contacts and the operating member in the rest position with the contacts in contact with the leads.
Figure 4:
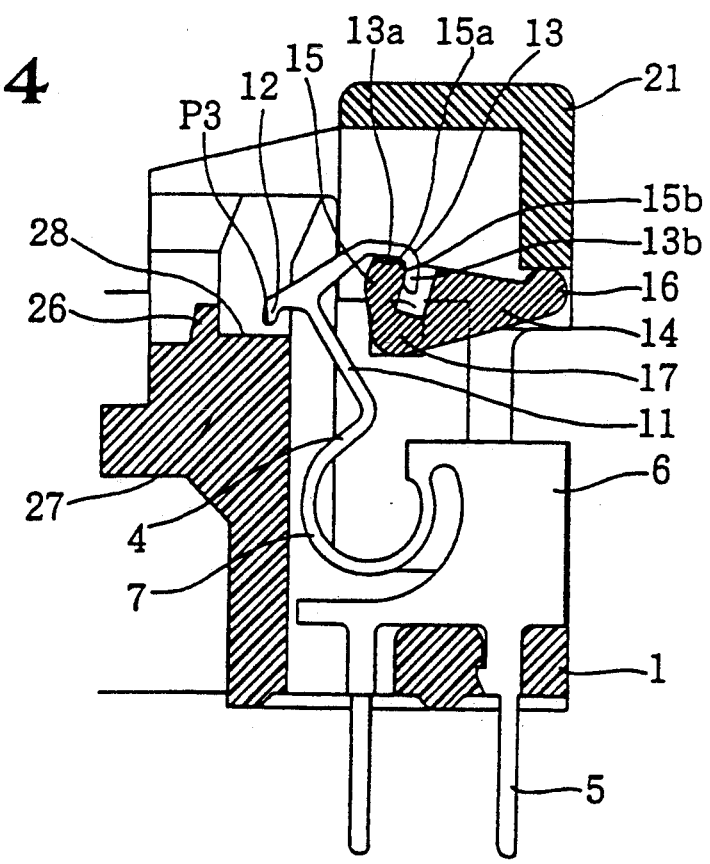
FIG. 4 is a view similar to FIG. 3 showing the operating member and associated cam portion having been moved so as to lift the contacts upwardly away from the leads.
Figure 5:
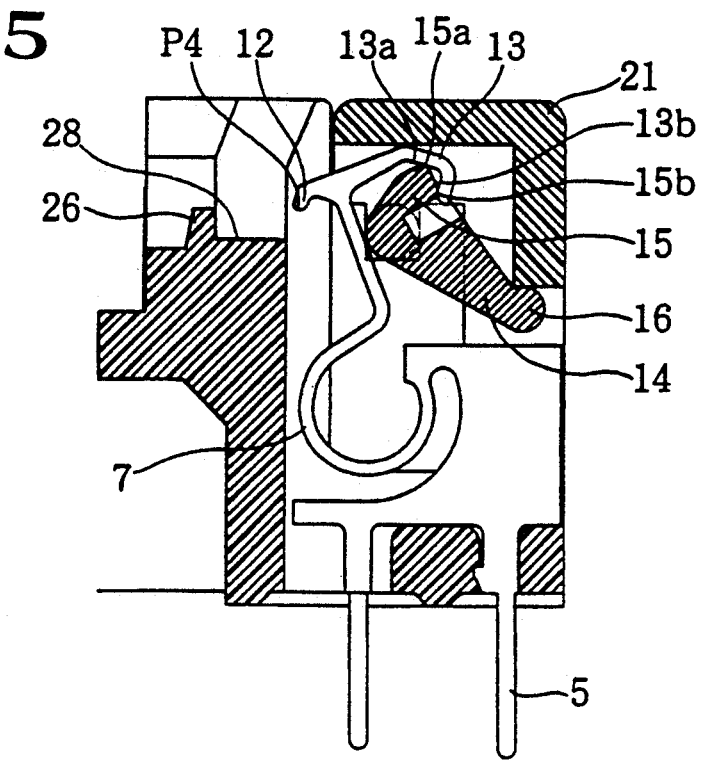
FIG. 5 is a view similar to FIGS. 3 and 4 showing the operating member and associated cam portion having been moved so as to move the contacts rearwardly away from the leads.
Figure 6:
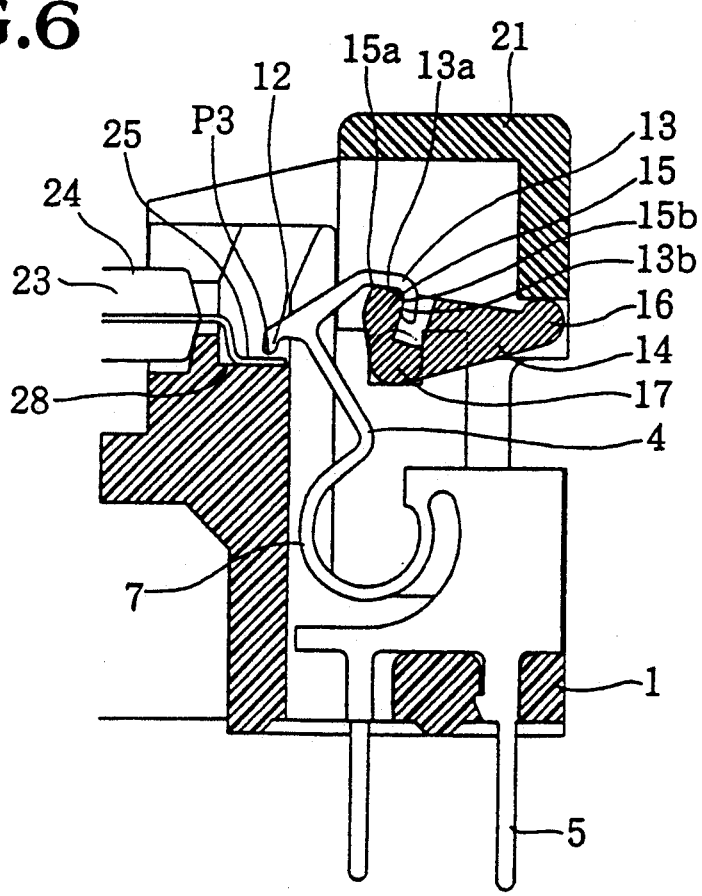
FIG. 6 is a view similar to FIGS. 3-5 showing the operating member and associated cam portion having been moved so as to allow the contacts to move forwardly toward the leads.
Figure 7:
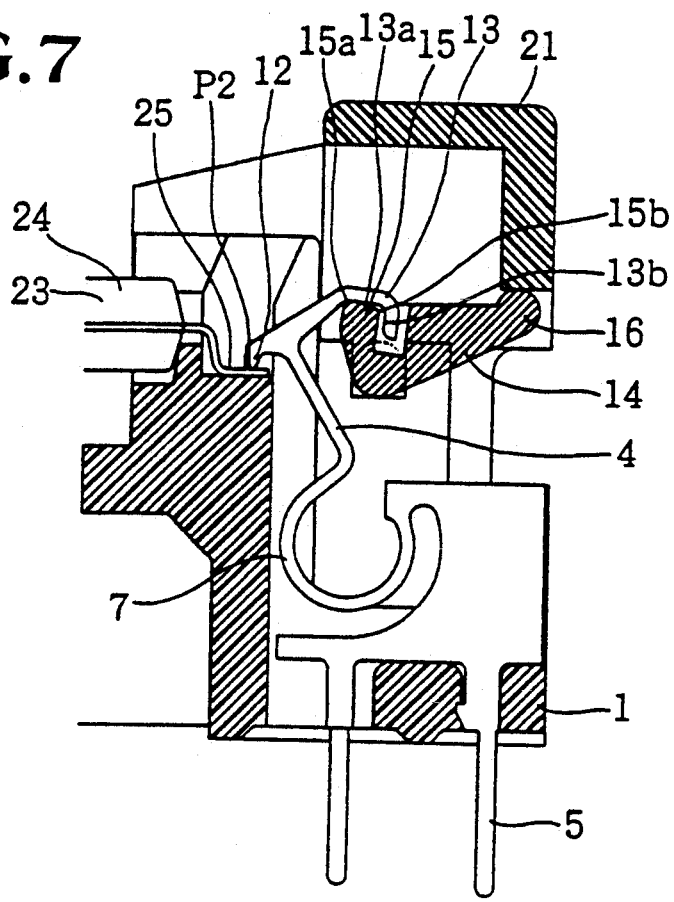
FIG. 7 is a view similar to FIGS. 3-6 showing the operating member and associated cam portion having been moved so as to allow the contacts to move downwardly onto the leads.
Figure 8:
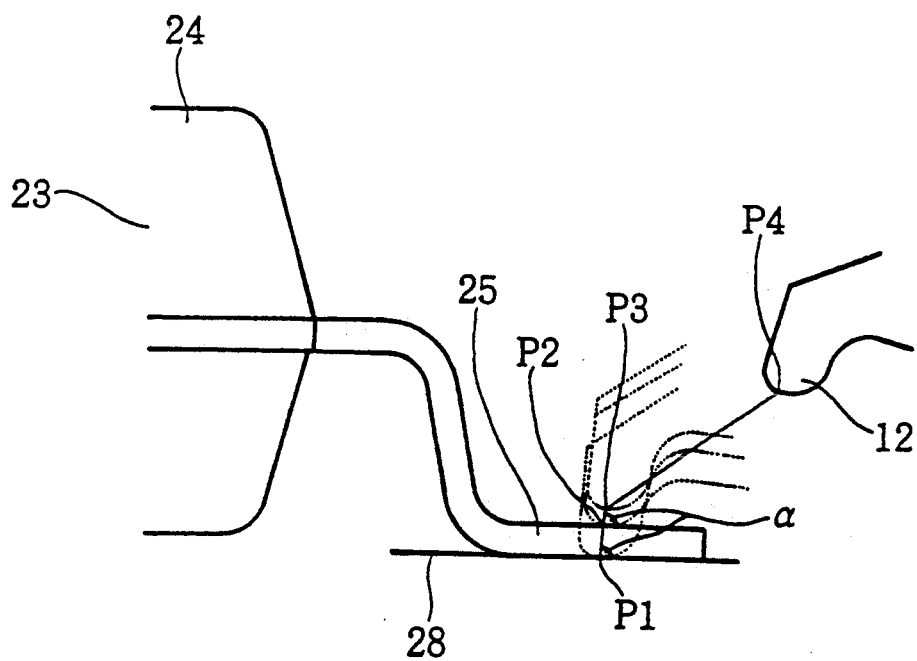
FIG. 8 is a side view of a lead and a contacting portion, showing how the contacting portion moves with respect to the lead.

As shown in FIG. 3, the spring portion 7 urges the contacting arm 11 and the contacting portion 12 inwardly so that the contacting portion 12 is brought into contact with a corresponding lead 25 of the circuit element 23. Furthermore, a hook portion 13 extends from the upper end of a connection arm 13' which extends upwardly at angle from the area of connection between the arm portion 11 and the connecting portion 12, and an acting portion 15 of the operating member 14 is brought into engagement with a free end of the hook portion 13.

The hook portion 13 and the contacting portion 12 are disposed at the free end of the contact and extending in the opposite direction from each other. A first cam portion 15a and a second cam portion 15b as will be described are formed on the acting portion 15, i.e., the surface of the acting portion.

Figure 2:
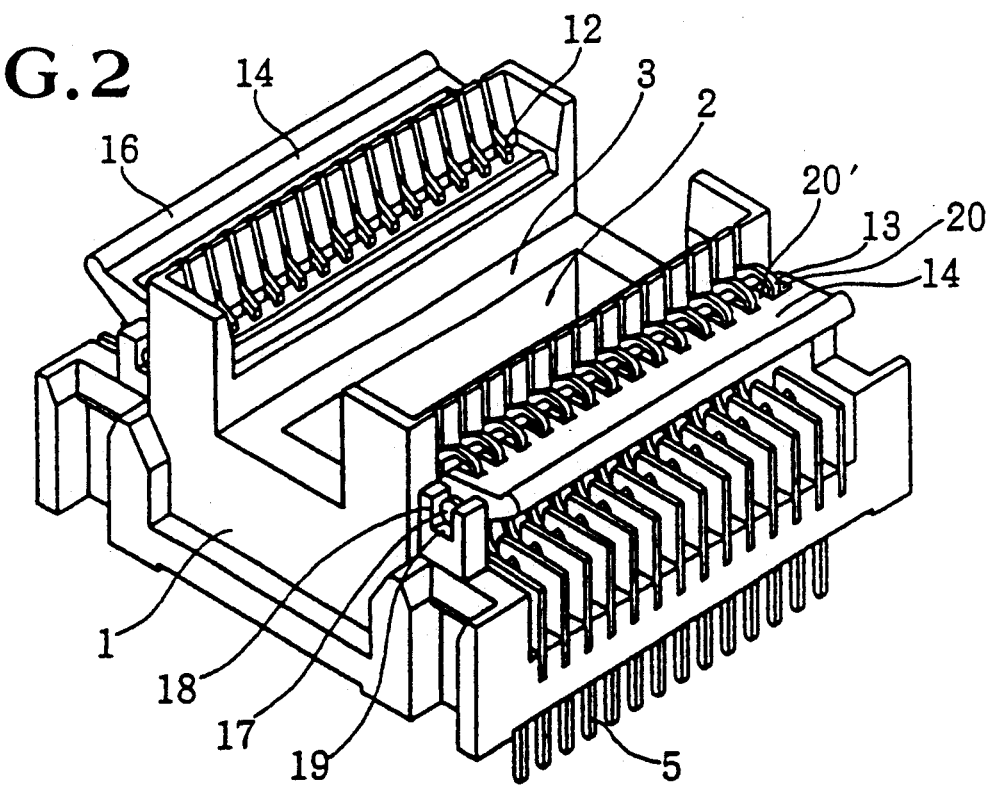
FIG. 2 is a perspective view of the socket of FIG. 1 but a pressure cover removed therefrom.

As shown in FIG. 2, the operating member 14 is an elongated pivotal member disposed in parallel relation with the rows of the contacts 4. The operating member 14 has an operating portion 16 extending outwardly from one end thereof and an acting portion 15 formed on the other end thereof so as to be engaged with the hook portions 13. The operating member 14, the operating portion 16, and the acting portion 15 are disposed at the outside of the contacting arm 11 in such a manner as to be in parallel relation with the rows of the contacts 4, and are pivotable upwardly and downwardly about an axis P parallel to the rows of the contacts 4.

The operating member 14 is provided at both ends thereof with a shaft portion 17 projecting along the axis P. The shaft portion 17 is rotatably fitted into a bearing portion 18 formed on the base member 1 in order to facilitate the pivotable movement of the operating member 14. The bearing portion 18 has a cut-out portion 19 which is open upwardly, and the shaft portion 17 is slip fitted into the cut-out portion 19 so that the operating member 14 can be removed upwardly from the cut-out portion 19, and engaged into the cut-out portion 19 from the above.

The operating member 14 is further provided with engaging holes 20 adjacent to the operating portion 16 and open upwardly. The engaging holes 20 are arranged in an array in the axial direction and separated by partition walls 20', respectively. By loosely inserting a bent over portion 13c at a foremost end of the hook portion 13 of each contact 4 into each engaging hole 20, the hook portion 13 is engaged with the acting portion 15.

The operating member is integrally formed of an insulating material, and is provided with the above-mentioned various elements 15, 16, 17 and 20.

In the illustrated example, the operating member 14 is supported such that it can be pivoted about the fixed axis P. In the operating member 14, the operating portion 16, as shown in FIG. 2, can be pushed down directly by a robot or a manual operation. Furthermore, as shown in FIGS. 1 and 3, a presser cover 21 is disposed at an upper portion of the base member 1, with a center window 22 of the cover 21 facing the accommodation space 3, so that the circuit element 23 can be inserted into and removed from the accommodation space 3 through the center window 22.

The circuit element 23 is, for example, an integrated circuit element, a printed wiring board, a liquid crystal panel or the like. The circuit element 23 has a plurality of leads 25 arranged in an array along the side portions of a main body 24.

As shown in FIG. 3, the first cam portion 15a is formed by an angular portion which is formed by a top surface of the acting portion 15 and one side surface of the acting portion 15. Similarly, the second cam portion 15b is formed by an angular portion which is formed by the top surface and the other side surface of the acting portion 15.

A first pressure bearing portion 13a is formed by an inner surface of a basal portion of the hook portion 13, and a second pressure bearing portion 13b is formed by an inner surface of the bent over portion 13c at the free end of the hook portion 13. The acting portion 15 is brought into engagement with the bent over portion 13c at the free end of the hook portion 13 and the inner surface of the basal portion, i.e., the first and second pressure bearing portions 13a, 13b, and the first cam portion 15a is brought into abutment with the inner surface constituting the first pressure bearing portion 13a. A predetermined space 30 is formed between a side surface (engaging surface) of the acting portion 15 and the inner surface forming the pressure bearing portion 13b of the bent over portion 13c at the foremost end of the hook portion 13, and the first and second cam portions 15a and 15b are arranged in the hook portion 13 such that the first and second cam portions 15a and 15b act on the first and second pressure bearing portions 13a and 13b, respectively, at successively different times. The arrangement is such that when the second cam portion 15b is exerting a backward pressure on the second pressure bearing portion 13b, the first cam portion 15a pushes up the first pressure bearing portion 13a.

The inner surface of the first pressure bearing portion 13a extends in a lateral direction, while the inner surface of the second pressure bearing portion 13b extends in a vertical direction. The first and second cam portions 15a, 15b act on the respective inner surfaces at successive times. More specifically, only after the first cam portion 15a begins to exert a pushing-up pressure on the first pressure bearing portion 13a, the second cam portion 15b acts on the second pressure bearing portion 13b after a delay in order to exert a backward pressure thereon.

As shown in FIGS. 3 to 8 inclusive, by pushing down the operating portion 16, the operating member 14 is pivoted downwardly about the shaft portion 17. As a result, the first cam portion 15a By this pushing-up operation, the contacting portion 12 is moved upwardly away from a lead supporting surface 28 and an upper surface of the lead 25. In other words, the contacting portion 12 is shifted from a point indicated by P1 or P2 to a point indicated by P3 in FIG. 8. An angle α formed between this shifting orbit and the lead is an angle of inclination which is generally equal to or larger than a right angle (perpendicular).

Next, while the first cam portion 15a is still pushing up the pressure bearing portion 13a, the second cam portion 15b exerts a backward pressure on the second pressure bearing portion 13b. As a result, the contacting portion 12 is also shifted backwardly at an angle from the point indicated by P3 toward a point indicated by P4 against the elasticity of the spring portion 7, and brought to an out-of-contact position where the contacting portion 12 does not interfere the lead 25 of the circuit element 23 accommodated in the accommodation space 3. Accordingly, the circuit element 23 can be inserted into the accommodation space 3 with no force or no load, and removed therefrom with no force or no load.

When the push-down pressure on the operating portion 16 is removed, the operating member 14 is pivoted upwardly by the elasticity of the spring portion 7 exerted on the acting portion 15 so as to be ready to be pushed down again. At the same time, the contacting arm 11 and contacting portion 12 of the contact 4 are shifted inwardly by the spring portion 7 so as to be pressure contacted with the upper surface of the lead 25 of the circuit element 23.

More specifically, as the contacting portion 12 is brought into contact with the upper surface of the lead 25, it is first brought from the point indicated by P4 to the point indicated by P2 via the point indicated by P2. Then, owing to the action of the first cam portion 15a, the contacting portion 12 is moved downward from the point P3 to the point P2 at the inclination angle α generally equal to or larger than a right angle (perpendicular) so as to be pressure contacted with the upper surface of the lead 25. Accordingly, the contacting portion 12 is contacted with the upper surface of the lead 25 with a comparatively large perpendicular pressure.

A positioning ridge 26 projecting upward is formed on a wall 27 defining the accommodation space 3. The side surface of the circuit element 24 is supported by the positioning ridge 26, and the lower surface of the lead 25 is supported on a lead supporting surface 28 formed on the upper surface of the partition wall 27 at the outer side of the positioning ridge 26. The contacting portion 12 is pressure contacted with the upper surface of the contact 25 thus supported, with a downward pressure.

When the circuit element 23 is absent as shown in FIG. 3, the contacting portion 12 is brought into abutment with the supporting surface 28 so that the contact 4 is not excessively shifted inwardly. More specifically, the supporting surface 28 forms a stop for limiting the inwardly shifting amount of the contact 4. As a result, the operating portion 16 of the swing lever 14 is normally swung upwardly to a fixed position by the elasticity of the contact so as to be ready to be pushed down.

As described in the foregoing, the first cam portion functions as means for moving the contacting portion of the contact generally upwardly away from the lead, and the second cam portion functions as means for moving the contacting portion of the contact generally backwardly away from the lead. Since the first and second cam portions have their own functions, there can be easily obtained a favorable design with a simple construction, in which the contacting portions of the contacts can not only be moved away from the leads but also brought into contact with the leads at an inclination angle generally equal to or larger than a right angle (perpendicular) with respect to upper surfaces of the leads respectively. Similarly, the contacting portions of the contacts can be moved backwardly efficiently by the second cam portion.

By virtue of the above-described arrangement, a vertical contact pressure of the contacting portion of each contact with respect to the upper surface of each lead can be obtained efficiently. As a result, each contacting portion can be highly reliably brought into contact with each lead with a high contact pressure. This contact pressure can be properly obtained particularly for minute contacts.

Furthermore, sine the contacting portions are brought into contact with the leads in an inclination angle generally equal to or larger than a right angle (perpendicular) with respect to upper surfaces of the leads respectively, possible collision between the leading ends of the leads and the contacting portions of the contacts, and possible damage resulting therefrom can be prevented effectively.

What is claimed is:

1. A circuit element receiving device for receiving a circuit element having a plurality of leads, said circuit receiving device comprising:

a plurality of contacts having elasticity and each having a contacting portion and movable between a contact position in which said contacting portion is normally urged by said elasticity for bringing said contacting portion into contact with a corresponding lead of a circuit element received in said device, and an out-of-contact position;

a hook portion on each of said contacts and having a portion extending laterally of a line perpendicular to a contact surface of a corresponding lead with a first pressure bearing portion on an inside surface of said laterally extending portion, and having a bent over portion on a free end of said laterally extending portion with a second pressure bearing portion on an inside surface of said bent over portion; and an operating member movably mounted on said circuit element receiving device for shifting said contacts away from the leads against said elasticity to the out-of-contact position, said operating member having an engaging portion with a first cam portion thereon engageable with said first pressure bearing portion for, when said operating member is started to be moved for shifting said contacts, moving said contacting portions of said contacts away from said leads against the elasticity of said contacts substantially in the direction of said line perpendicular to the contact surfaces of corresponding leads, and a having second cam portion thereon engageable with said second pressure bearing portion for, when said operating member is continued to be moved for shifting said contacts, moving said contacting portions laterally of said perpendicular line away from said leads, said second cam portion and said second pressure bearing portion being spaced from each other when said contacts are in said contact position, whereby said first cam portion acts on said contacts prior to said second cam portion acting on said contacts.

2. A socket for an electric part including an accommodating space for accommodating an electric part, and a plurality of contacts arranged in parallel relation to form rows of contacts along at least two opposing sides of said accommodating space, each of said contacts being provided with a contacting portion to be contacted with a corresponding laterally extending lead of the electric part accommodated within said accommodating space, and a curved spring portion adapted to urge said contacting portion inwardly to obtain a contacting pressure with said corresponding lead of said electric part, said socket further having a pivotal lever pivotally supported along an external side of each of said rows of contacts for vertical pivotal movements about a fixed fulcrum, said pivotal lever having an operating portion formed on one end thereof and adapted to be operated to cause pivotal movement of said lever in a vertical direction, and an acting portion formed on the other end of said lever, each said contact having a latch portion which extends away from said spring portion in an opposite direction with respect to said contacting portion and which has a free end bent downwardly to form a hook portion, said latch portion having a first pressure bearing portion on an under side thereof and said free end having a second pressure bearing portion an a side thereof facing inwardly of said hook portion, said acting portion having a first cam portion thereon engageable with said first pressure bearing portion for, when said lever is started to be pivoted, moving said contacting portions of said contacts away from said leads against the elasticity of said spring portions substantially vertically, and said acting portion having a second cam portion thereon engageable with said second pressure bearing portion for, when said operating member is continued to be moved for shifting said contacts, moving said contacting portions laterally away from said leads, said second cam portion and said second pressure bearing portion being spaced from each other when said lever is in the unpivoted position, whereby said first cam portion acts on said contacts prior to said second cam portion acting on said contacts.

* * * * *